United States Patent
Yoo et al.

(10) Patent No.: US 11,594,681 B2
(45) Date of Patent: Feb. 28, 2023

(54) MASK AND METHOD OF MANUFACTURING MASK

(71) Applicant: Samsung Display Co., Ltd., Yongin-Si (KR)

(72) Inventors: Inkyung Yoo, Hwaseong-si (KR); Sangjin Park, Yongin-si (KR); Donghyun Yang, Seongnam-si (KR); Sungbae Ju, Hwaseong-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 17/703,195

(22) Filed: Mar. 24, 2022

(65) Prior Publication Data

US 2022/0216405 A1 Jul. 7, 2022

Related U.S. Application Data

(62) Division of application No. 16/601,490, filed on Oct. 14, 2019, now Pat. No. 11,316,108.

(30) Foreign Application Priority Data

Nov. 14, 2018 (KR) ........................ 10-2018-0139876

(51) Int. Cl.
*H01L 51/00* (2006.01)
*H01L 51/56* (2006.01)

(52) U.S. Cl.
CPC .......... *H01L 51/0002* (2013.01); *H01L 51/56* (2013.01)

(58) Field of Classification Search
CPC ..... H01L 51/0002; H01L 51/56; C23C 18/54; C23C 18/31; C23C 18/42; C23C 18/1633
See application file for complete search history.

(56) References Cited

U.S. PATENT DOCUMENTS

| 4,877,480 A | 10/1989 | Das |
| 10,727,409 B2 | 7/2020 | Seong |
| 2015/0059643 A1 | 3/2015 | Du et al. |
| 2016/0263607 A1 | 9/2016 | Wang et al. |
| 2019/0084088 A1* | 3/2019 | Takei ................. H01L 51/0011 |
| 2020/0303179 A1* | 9/2020 | Sakio ................. H01L 51/0014 |

FOREIGN PATENT DOCUMENTS

| KR | 10-0947550 B1 | 3/2010 |
| KR | 10-2016-0081136 A | 7/2016 |
| KR | 10-1663818 B1 | 10/2016 |
| KR | 10-1794442 B1 | 12/2017 |

* cited by examiner

*Primary Examiner* — Michael P Wieczorek
(74) *Attorney, Agent, or Firm* — Innovation Counsel LLP

(57) ABSTRACT

A method for manufacturing a mask includes providing a mask mother substrate including a first portion and a plurality of second portions adjacent to the first portion, forming a reflecting plate on the mask mother substrate, forming a photoresist layer on the reflecting plate, removing a third portion of the photoresist layer that overlaps the plurality of second portions using an auxiliary mask, removing a fourth portion of the reflecting plate that overlaps the plurality of second portions, and removing the plurality of second portions of the mask mother substrate using a laser.

3 Claims, 11 Drawing Sheets

MASK AND METHOD OF MANUFACTURING MASK

CROSS-REFERENCE TO RELATED APPLICATION

This application a divisional application of U.S. patent application Ser. No. 16/601,490 filed on Oct. 14, 2019, which claims priority under 35 U.S.C. § 119 to Korean Patent Application No. 10-2018-0139876, filed on Jun. 27, 2019, in the Korean Intellectual Property Office (KIPO), the contents of which are herein incorporated by reference in their entireties.

BACKGROUND

The present disclosure herein relates to a mask, and more specifically, to a mask for depositing a light emitting layer, and a method of manufacturing the mask.

Among various types of display devices, an organic light emitting display device is attracting attention as a next-generation display device due to its wide viewing angle, excellent contrast, and quick response time.

An organic light emitting display device may emit visible rays when holes and electrons injected from an anode and a cathode are recombined in an organic light emitting layer and emit light. Meanwhile, electrodes, organic light emitting layers, and other layers of an organic light emitting display device may be formed by various methods and processes. For example, in a deposition method, a fine metal mask (FMM) having a predetermined pattern is closely adhered to a surface of a substrate, and a material of a thin film is deposited on the substrate using the FMM to form the thin film having the predetermined pattern. That is, to form a desired thin film pattern by a deposition method, a mask having the same size as an organic light emitting display device is used.

In recent years, as a size of a display device increases, a large mask having a precise pattern has been developed and used. For example, a precise pattern may be formed on a mask using a laser, and a portion of the mask may be removed using the laser. However, portions of the mask that is not to be removed may be irradiated with the laser causing a damage to the mask.

SUMMARY

The present disclosure provides a mask and a method of manufacturing the mask capable of preventing a damage to the mask when a portion of the mask is removed using a laser.

An embodiment of the inventive concept provides a method of manufacturing a mask including providing a mask mother substrate including a first portion and a plurality of second portions adjacent to the first portion, forming a reflecting plate on the mask mother substrate, forming a photoresist layer on the reflecting plate, removing a third portion of the photoresist layer that overlaps the plurality of second portions using an auxiliary mask, removing a fourth portion of the reflecting plate that overlaps the plurality of second portions, and removing the plurality of second portions of the mask mother substrate using a laser.

In an embodiment, the auxiliary mask may include a plurality of openings overlapping the plurality of second portions, and the third portion of the photoresist layer overlapping the plurality of second portions may be removed through an exposure process using the auxiliary mask.

In an embodiment, the third portion of the photoresist layer overlapping the plurality of second portions and the fourth portion of the reflecting plate overlapping the plurality of second portions may be removed through an etching process.

In an embodiment, the reflecting plate may reflect light corresponding to a wavelength in a wavelength range of the laser.

In an embodiment, the reflecting plate may be provided as a metal film.

In an embodiment, removing the fourth portion of the reflecting plate overlapping the plurality of second portions, and removing other portions of the photoresist layer overlapping the first portion may be further included.

In an embodiment, the mask mother substrate may be formed of invar.

In an embodiment, a first thickness of the mask mother substrate may be greater than a second thickness of the reflecting plate.

In an embodiment, the method of manufacturing a mask may further include detecting the laser reflected by the reflecting plate through an inspection device.

In an embodiment of the inventive concept, a method of manufacturing a mask includes providing a conductive substrate on which a photoresist layer including a plurality of openings is formed, forming a reflective metal layer by performing electroplating on the conductive substrate overlapping the plurality of openings, forming a mask mother substrate on the reflective metal layer, separating the conductive substrate from the reflective metal layer and the mask mother substrate, and removing portions of the mask mother substrate that do not overlap the reflective metal layer using a laser.

In an embodiment, a first thickness of the mask mother substrate may be greater than a second thickness of the reflecting plate.

In an embodiment, the reflective metal layer may reflect light corresponding to a wavelength in a wavelength range of the laser.

In an embodiment of the inventive concept, a mask includes a mother substrate including a plurality of openings spaced apart from each other in a plan view, and a reflecting plate disposed on the mother substrate.

In an embodiment, the reflecting plate may be provided as a metal film.

In an embodiment, a first thickness of the mother substrate may be greater than a second thickness of the reflecting plate.

BRIEF DESCRIPTION OF THE FIGURES

The accompanying drawings are included to provide a further understanding of the inventive concept, and are incorporated in and constitute a part of the present specification. The drawings illustrate exemplary embodiments of the inventive concept and, together with the description, serve to explain principles of the inventive concept. In the drawings.

DETAILED DESCRIPTION

Figure 1:
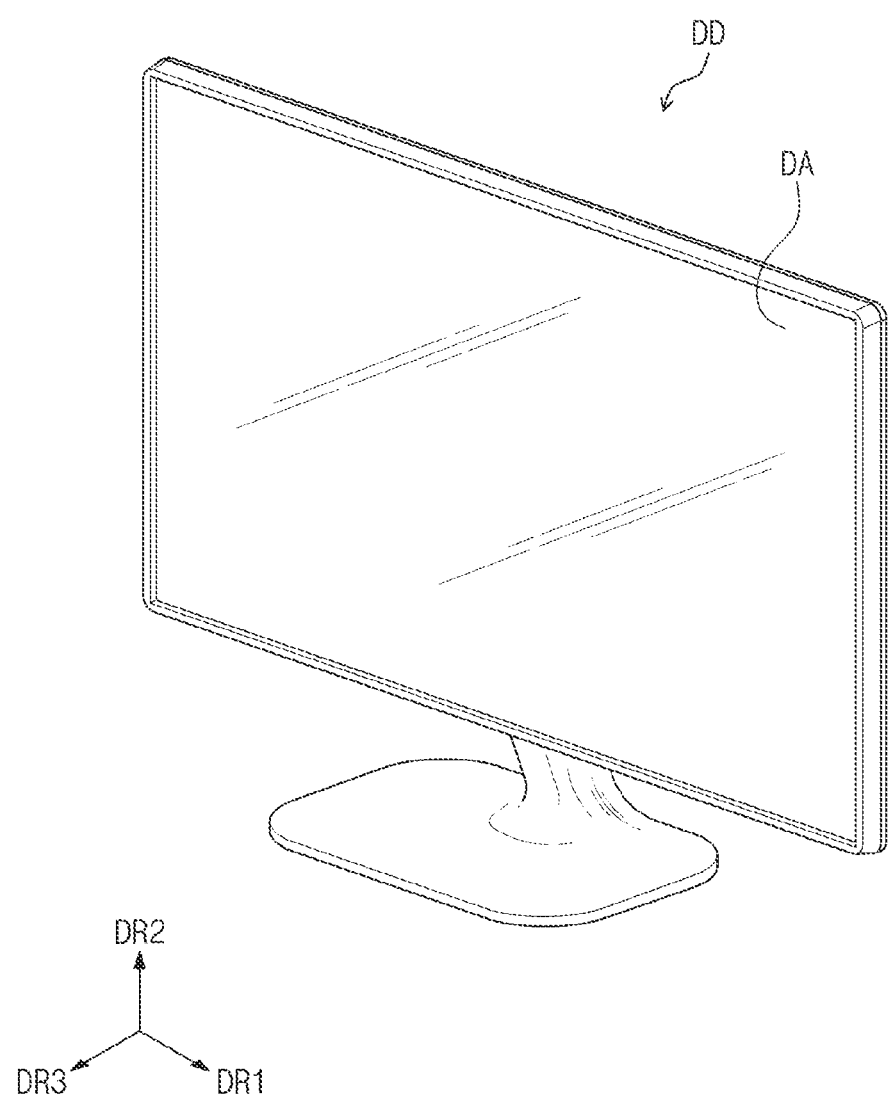
FIG. 1 is a perspective view of a display device according to an embodiment of the inventive concept.

In the present disclosure, when an element (or a region, a layer, a portion, etc.) is referred to as being "on," "connected to," or "coupled to" another element, it means that the element may be directly disposed on/connected to/coupled to the other element, or that a third element may be disposed therebetween.

Like reference numerals refer to like elements. In addition, in the drawings, the thickness, the ratio, and the dimensions of elements are exaggerated for an effective and convenient description of technical merits of the elements.

The term "and/or" includes all or any combinations of one or more of which associated configurations may define.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the example embodiments of the inventive concept. The terms of a singular form may include a plural form unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings. That is, it is understood that these relational terms may encompass various other configurations in addition to those shown in the drawings without deviating from the scope of the present disclosure.

Unless otherwise defined, terms (including technical and scientific terms) used herein have the same meaning as commonly understood by one of ordinary skill in the art to which the inventive concept pertains. It is also to be understood that terms defined in commonly used dictionaries should be interpreted as having meanings consistent with the meanings in the context of the related art, and they are not interpreted in an ideal or overly formal sense unless they are expressly defined otherwise.

It should be understood that the terms "comprise" or "have" are intended to specify the presence of stated features, integers, steps, operations, elements, components, or combinations thereof, but do not preclude the presence or addition of one or more other features, integers, steps, operations, elements, components, or combinations thereof.

Hereinafter, exemplary embodiments of the inventive concept will be described with reference to the accompanying drawings.

FIG. 1 is a perspective view of a display device according to an embodiment of the inventive concept. Referring to FIG. 1, a display device DD may display an image through a display area DA. In FIG. 1, the display area DA is exemplarily illustrated as being provided on a planar surface defined by a first direction DR1 and a second direction DR2 that crosses the first direction DR1. The thickness direction of the display device DD is indicated by a third direction DR3. The directions indicated by the first to third directions DR1, DR2, and DR3 are a relative concept, and may be converted to different directions depending on the orientation and configuration of the display device DD. In the present disclosure, "when viewed in a plan view," or "in a plan view" may mean when viewed from the direction DR3. In addition, the "thickness direction" may be the third direction DR3.

In FIG. 1, the display device DD is exemplarily illustrated as a television. However, the display device DD may be used for other large electronic devices such as a monitor, or an external advertisement board as well as for small and medium-sized electronic devices such as a personal computer, a notebook computer, a personal digital terminal, a car navigation system, a game machine, a smart phone, a tablet computer, and a camera. It should be understood that these are merely exemplary embodiments, and the display device DD may be or may be integrated in other electronic devices without departing from the inventive concept of the present disclosure.

Meanwhile, the display device DD shown in FIG. 1 may be a display device manufactured using a mask MSK according to the inventive concept to be described later.

Figure 2:
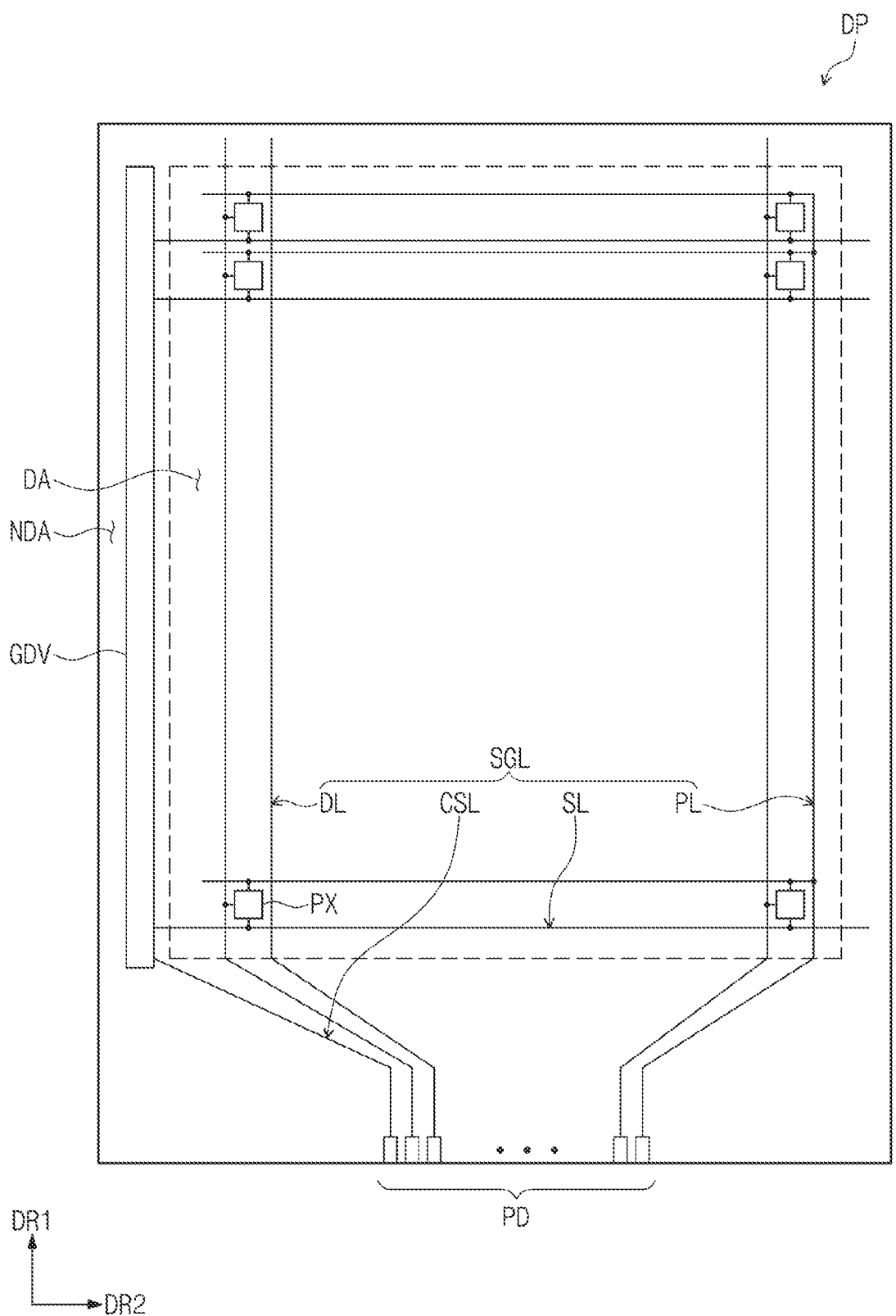
FIG. 2 is a plan view of a display panel according to an embodiment of the inventive concept.
Figure 3A:
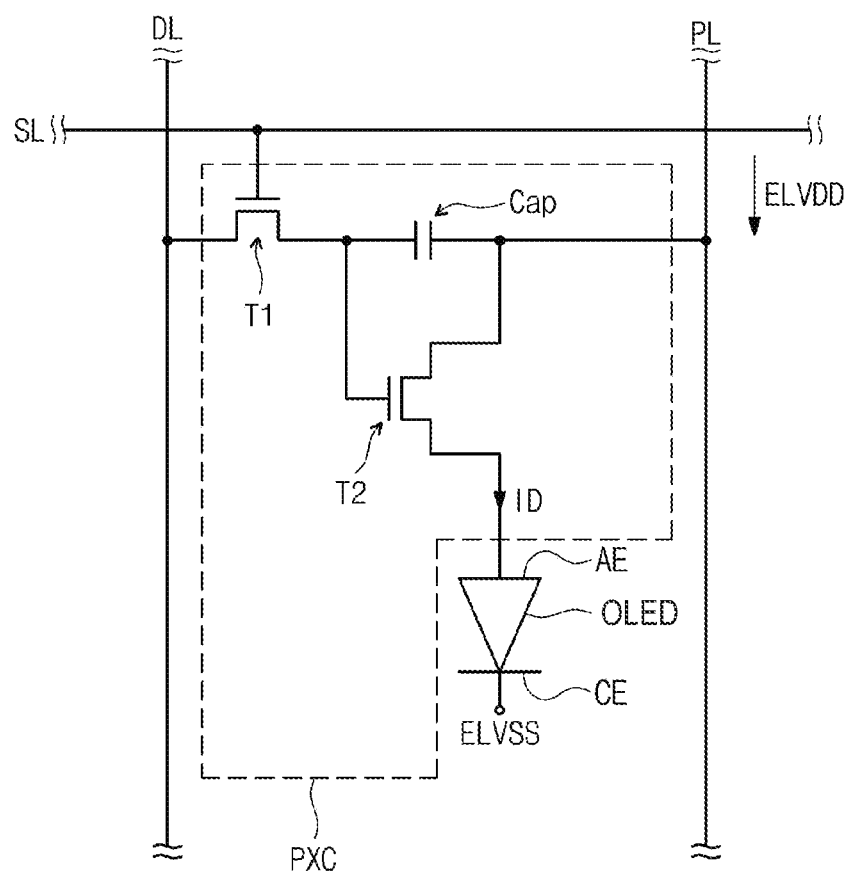
FIG. 3A is an equivalent circuit diagram of a pixel shown in FIG. 2.
Figure 3B:
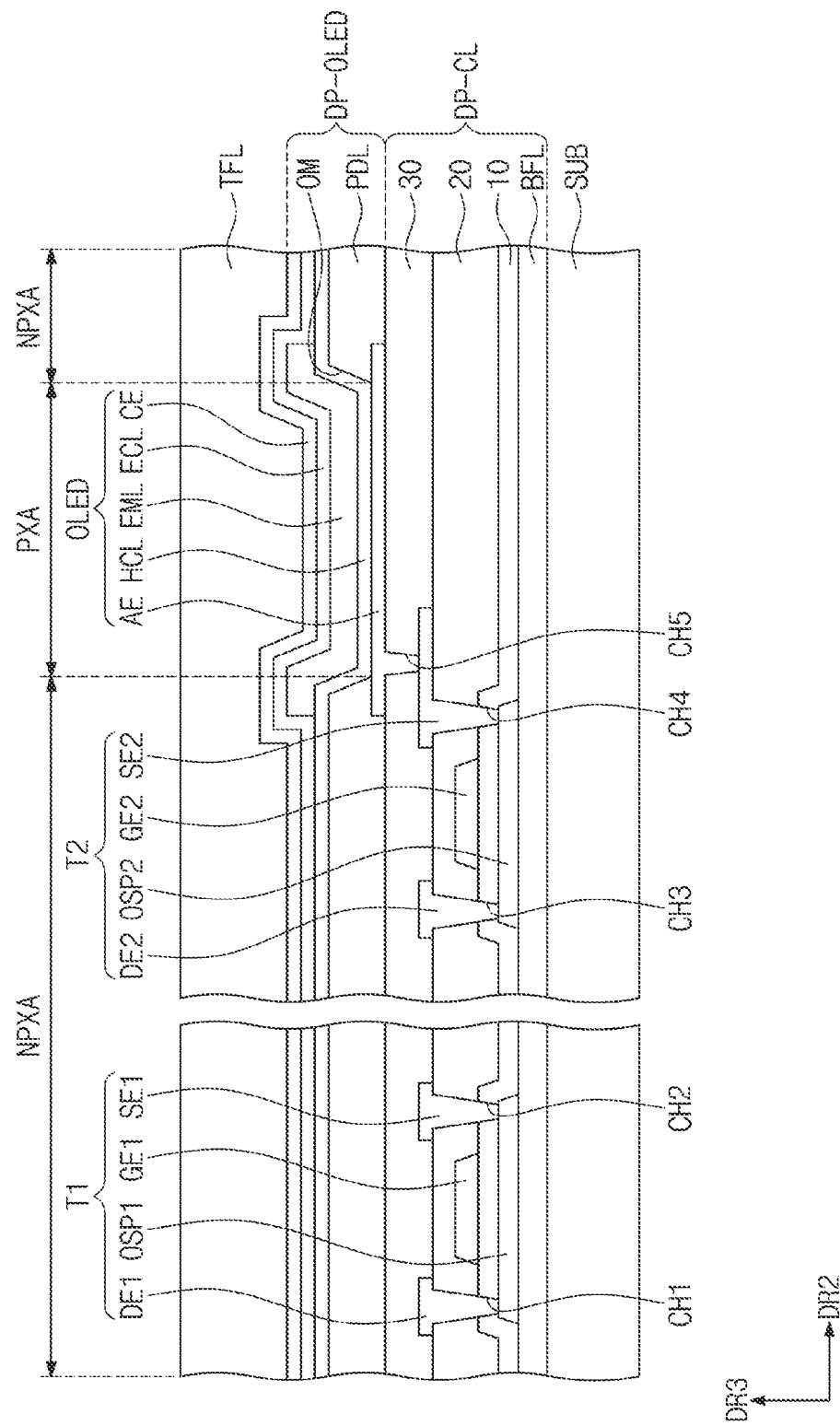
FIG. 3B is a cross-sectional view showing a portion of a display panel according to an embodiment of the inventive concept.

FIG. 2 is a plan view of a display panel according to an embodiment of the inventive concept. FIG. 3A is an equivalent circuit diagram of a pixel shown in FIG. 2. FIG. 3B is a cross-sectional view showing a portion of a display panel according to an embodiment of the inventive concept.

Referring to FIG. 2, the display panel DP includes a display area DA and a non-display area NDA. The display area DA of the display panel DP may correspond to the display area DA of the display device DD shown in FIG. 1. The display panel DP includes a scan driving circuit GDV, a plurality of signal lines SGL, a plurality of pixels PX, and a plurality of driving pads PD. An area on which the plurality of pixels PD are disposed is defined as the display area DA.

The scan driving circuit GDV generates a plurality of scan signals and outputs the plurality of scan signals sequentially to a plurality of scan lines SL. The scan driving circuit GDV may further output another control signal to a driving circuit for each of the pixels PX.

The plurality of signal lines SGL include the scan lines SL, data lines DL, a power line PL, and a control signal line CSL.

Each of the scan lines GL is connected to a corresponding pixel PX among the plurality of pixels PX, and each of the data lines DL is connected to a corresponding pixel PX among the plurality of pixels PX. The power line PL is connected to the plurality of pixels PX. In addition, the scan driving circuit GDV to which the scan lines SL are connected may be disposed in the non-display area NDA. The control signal line CSL may provide control signals to the scan driving circuit GDV.

Some of the scan lines SL, the data lines DL, the power line PL, and the control signal line CSL are disposed in the same layer, while others of them are disposed in another layer. When some signal lines of the scan lines SL, the data lines DL, the power line PL, and the control signal line CSL disposed in any one layer are defined as a first signal line, other signal lines disposed in a different layer may be defined as a second signal line. Further, other signal lines disposed in another layer may be defined as a third signal line.

The display panel DP may include the plurality of driving pads PD electrically connected to the data lines DL, the power line PL, and the control signal line CSL. The driving pads PD may overlap the non-display area NDA.

FIG. 3A exemplarily shows the pixel PX that is connected to one scan line GL, one data line DL, and the power line PL. The configuration of the pixel PX is not limited thereto, and may be modified and executed without deviating from the scope of the present disclosure.

According to the inventive concept, the pixel PX includes an organic light emitting diode OLED, a first electrode AE, a second electrode CE, and a pixel circuit PXC. The pixel PX includes the organic light emitting diode OLED as a display element.

The organic light emitting diode OLED, the first electrode AE, and the second electrode CE may be included in a display element layer DP-OLED shown in FIG. 3B. The organic light emitting diode OLED may be a front emission type light emitting diode, or a bottom emission type light emitting diode.

The pixel circuit PXC includes a first transistor T1 (or a switching transistor), a second transistor T2 (or a driving transistor), and a capacitor Cap for driving the organic light emitting diode OLED. The pixel circuit PXC may be included in a circuit element layer DP-CL shown in FIG. 3B.

The organic light emitting diode OLED generates light by an electrical signal that is provided from the first and second transistors T1 and T2.

The first transistor T1 outputs a data signal that is applied to the data line DL in response to a scan signal that is applied to the scan line SL. The capacitor Cap charges a voltage corresponding to the data signal received from the first transistor T1. A first power voltage ELVDD is provided to the first electrode AE through the second transistor T2, and a second power voltage ELVSS is provided to the second electrode CE. The second power voltage ELVSS may be lower than the first power voltage ELVDD.

The second transistor T2 is electrically connected to the organic light emitting diode OLED through the first electrode AE. The second transistor T2 controls a driving current ID that flows through the organic light emitting diode OLED in accordance with the amount of charge stored in the capacitor Cap. The organic light emitting diode OLED emits light during a turn-on period of the second transistor T2.

FIG. 3B shows a partial cross-section of the display panel DP corresponding to the equivalent circuit shown in FIG. 3A. On a base substrate SUB, the circuit element layer DP-CL, the display element layer DP-OLED, and an insulation layer TFL are sequentially disposed.

The circuit element layer DP-CL may include at least one insulation layer and a circuit element. The circuit element may include a signal line and a driving circuit for a pixel, and the like. The circuit element layer DP-CL may be formed through a forming process of an insulation layer, a semiconductor layer, and a conductive layer by various manufacturing processing including, but not limited to, coating, deposition, and the like, and a patterning process of the insulation layer, the semiconductor layer, and the conductive layer by a photolithography process.

The circuit element layer DP-CL may include a buffer film BFL that is an inorganic film, a first intermediate inorganic film 10, and a second intermediate inorganic film 20, and may further include an intermediate organic film 30 that is an organic film. The buffer film BFL may include a plurality of laminated inorganic films. The first transistor T1 may include a first semiconductor pattern OSP1, a first control electrode GE1, a first input electrode DE1, and a first output electrode SE1. The first input electrode DE1 and the first output electrode SE1 may be respectively connected to first and second regions of the first semiconductor pattern OSP1 via through holes CH1 and CH2. Similarly, the second transistor T2 may include a second semiconductor pattern OSP2, a second control electrode GE2, a second input electrode DE2, and a second output electrode SE2. The second input electrode DE2 and the second output electrode SE2 may be respectively connected to first and second regions of the second semiconductor pattern OSP2 via through holes CH3 and CH4.

The display element layer DP-OLED may include the organic light emitting diode OLED and a pixel definition film PDL. The pixel definition film PDL may be an organic layer.

On the intermediate organic film 30 (hereinafter, also referred to as a 'planarization layer'), the first electrode AE is disposed. The first electrode AE is connected to the second output electrode SE2 through a fifth through-hole CH5 that passes through the planarization layer 30. On the pixel definition film PDL, an opening OM is defined. The opening OM of the pixel definition film PDL exposes at least a portion of the first electrode AE. Herein, the opening OM of the pixel definition film PDL may be referred to as a light emitting opening to be distinguished from the other openings including the through holes CH1 to CH4.

Although not separately shown, on the top surface of the pixel definition film PDL, a spacer overlapping a portion of the pixel definition film PDL may be disposed. The spacer may be integrally formed with the pixel definition film PDL or may be an insulation layer formed by an additional process.

The display area DA of the display panel DP may include a light emitting area PXA and a non-light emitting area NPXA that is adjacent to the light emitting area PXA. The non-light emitting area NPXA may surround the light emitting area PXA. In one embodiment, the light emitting area PXA may overlap a region defined by the opening OM and the first electrode AE that is exposed by the opening OM.

A hole control layer HCL may be commonly disposed in the light emitting area PXA and the non-light emitting area NPXA. The hole control layer HCL may include a hole transport layer and may further include a hole injection layer. On the hole control layer HCL, a light emitting layer EML may be disposed. The light emitting layer EML may be disposed in a region corresponding to the opening OM. That is, the light emitting layer EML may be divided and formed in each of the plurality of pixels PX. The light emitting layer EML may include an organic material and/or an inorganic material. The light emitting layer EML may generate a predetermined colored light, for example, red, green, and blue. The colors of the light that the light emitting layer EML generate may not be limited thereto, and the light that the light emitting layer EML may emit other colors without deviating from the scope of the present disclosure.

On the light emitting layer EML, an electron control layer ECL is disposed. The electron control layer ECL may include an electron transport layer, and may further include an electron injection layer. The hole control layer HCL and the electron control layer ECL may be commonly formed in the plurality of pixels PX using an open mask. On the electron control layer ECL, the second electrode CE may be disposed. The second electrode CE may have an integral shape and may be commonly disposed on the electron control layer ECL included in each of the plurality of pixels PX.

On the second electrode CE, the insulation layer TFL may be disposed. The insulation layer TFL may be provided as a single encapsulation layer, or may be provided as a plurality of thin films. Hereinafter, the insulation layer TFL is also referred to as an encapsulation layer.

According to one embodiment, the light emitting layer EML may be deposited on the first electrode AE using a mask to overlap the light emitting opening OM. In accordance with an increase in size of the display panel DP, the display panel DP may include a large number of pixels PX encompassing a large area. In this case, a plurality of openings for depositing a plurality of light emitting layers EML included in the plurality of pixels PX may be defined on a mask. In a plan view, the shape of each of the plurality of openings defined on the mask may correspond to the light emitting opening OM.

Hereinafter, a method for forming a plurality of openings on a mask corresponding to the number of the light emitting layers EML is described.

FIGS. 4A to FIG. 4E are cross-sectional views showing a method of manufacturing a mask according to an embodiment of the inventive concept.

Figure 4A:
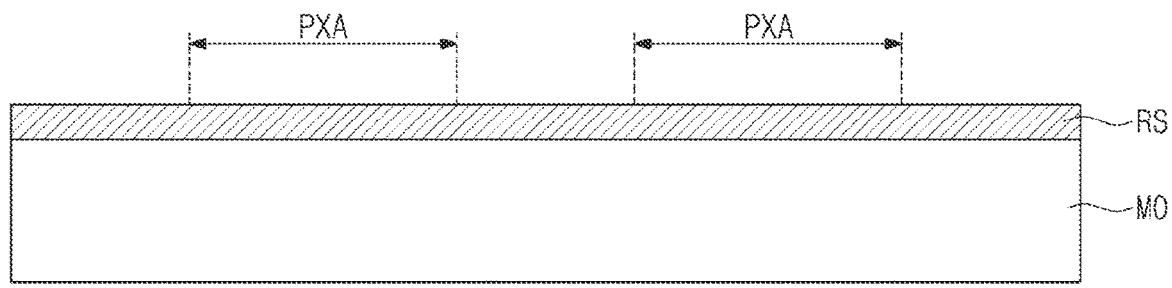
FIGS. 4A to FIG. 4E are cross-sectional views showing a method of manufacturing a mask according to an embodiment of the inventive concept.

Referring to FIG. 4A, a mask mother substrate MO is provided. The mask mother substrate MO may correspond to a substrate before a plurality of openings are formed. As an example, the mask mother substrate MO may be formed of invar. Although not shown, the mask mother substrate MO may be disposed on a stage and supported by the stage.

On the mask mother substrate MO, a reflecting plate RS may be formed. The reflecting plate RS may be provided as a metal film capable of reflecting a laser having a wavelength within a specific wavelength range. Here, the thickness of the mask mother substrate MO may be provided to be greater than the thickness of the reflecting plate RS.

The mask mother substrate MO may include a first portion and a plurality of second portions adjacent to the first portion. Illustratively, the plurality of second portions may be surrounded by the first portion. As the plurality of second portions are removed by a laser later, a plurality of openings respectively corresponding to a plurality of pixel areas PXA may be formed on the mask mother substrate MO.

Figure 4B:
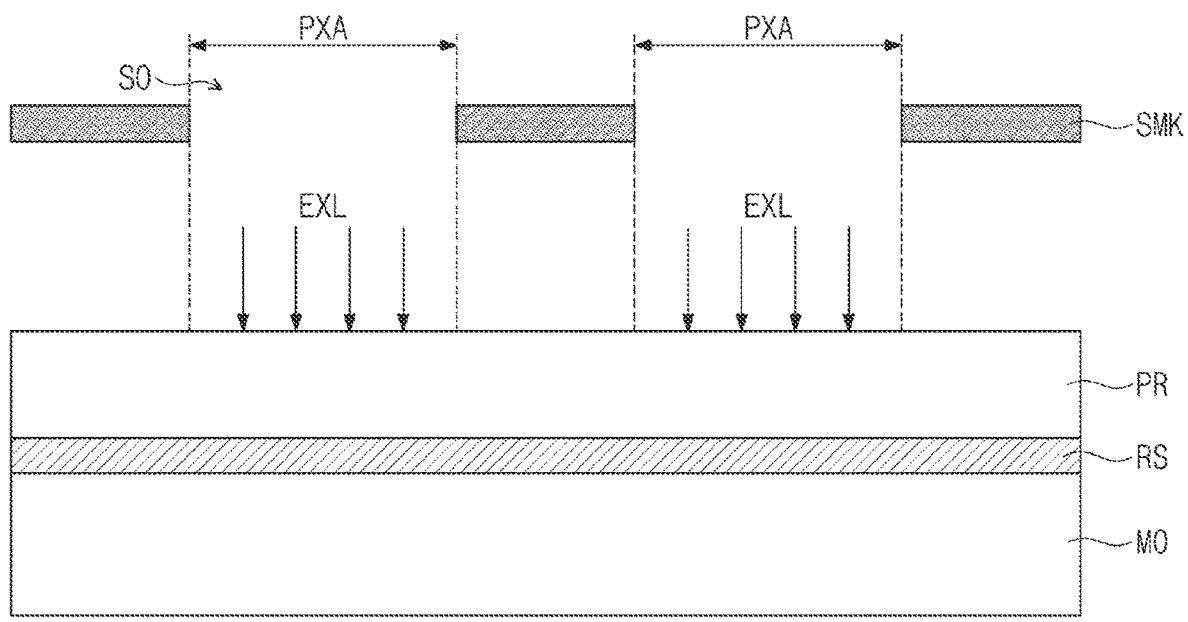

Referring to FIG. 4B, a photoresist layer PR is formed on the reflecting plate RS. Above the photoresist layer PR, an auxiliary mask SMK may be disposed. The auxiliary mask SMK may be spaced apart from the photoresist layer PR. A portion of the photoresist layer PR may be subjected to an exposure process EXL using the auxiliary mask SMK.

Specifically, the auxiliary mask SMK may include a plurality of openings SO corresponding to the plurality of second portions of the mask mother substrate MO. A portion of the photoresist layer PR overlapping the plurality of openings SO may be removed by the exposure process EXL.

Figure 4C:
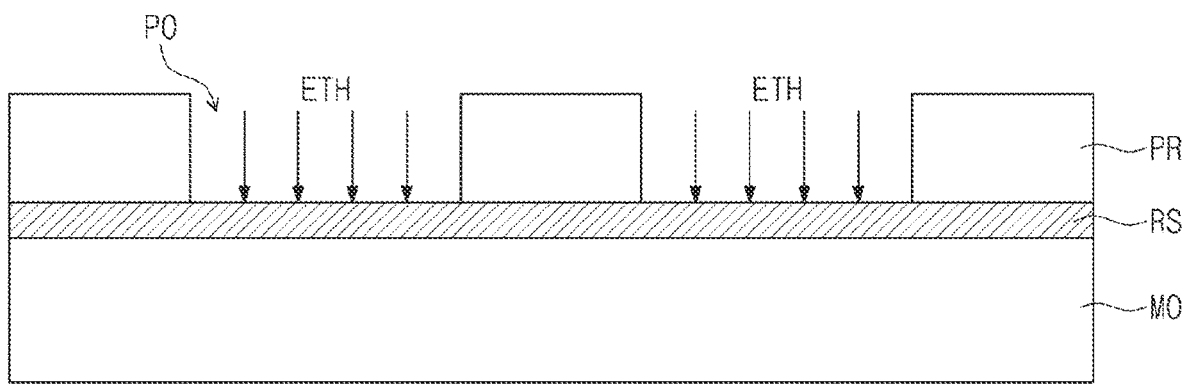

FIG. 4C shows that a portion of the photoresist layer PR corresponding to the plurality of openings SO of the auxiliary mask SMK has been removed through the exposure process EXL. As a result, a plurality of openings PO overlapping the plurality of second portions of the mask mother substrate MO may be formed in the photoresist layer PR.

Thereafter, through an etching process ETH, portion of the reflecting plate RS overlapping the plurality of second portions of the mask mother substrate MO may be removed. For example, the portion of the reflecting plate RS overlapping the plurality of second portions of the mask mother substrate MO may be removed through dry etching or wet etching.

Thereafter, other portions of the photoresist layer PR disposed on the reflecting plate RS may be removed. For example, those other portions of the photoresist layer PR may correspond to remaining portions of the photoresist layer PR excluding the portion that has been removed through the exposure process EXL.

Figure 4D:
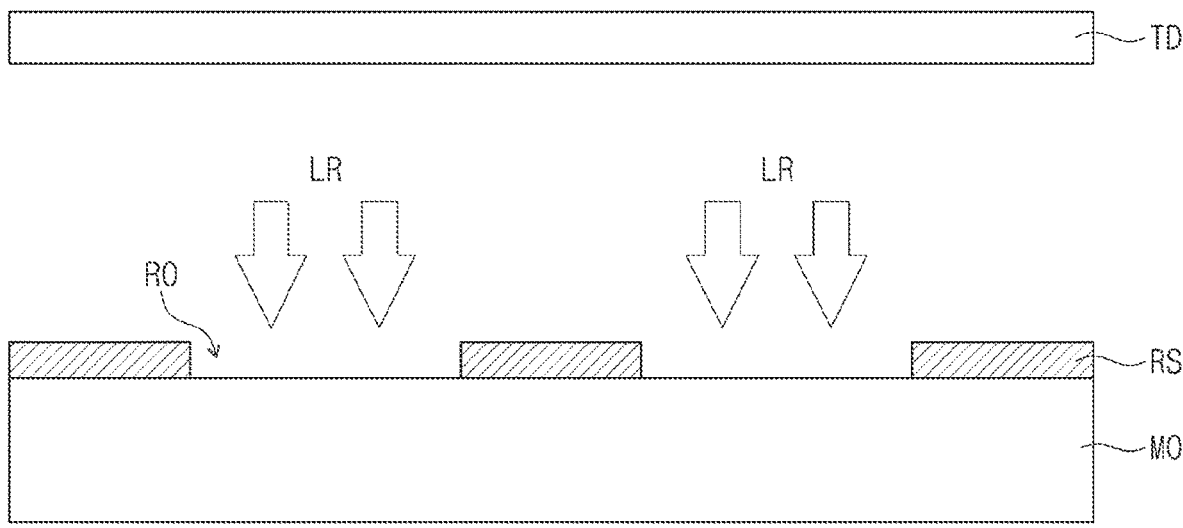

Referring to FIG. 4D, a plurality of openings RO may be formed in the reflecting plate RS through an etching process. Thereafter, the plurality of second portions of the mask mother substrate MO exposed by the plurality of openings RO may be irradiated with a laser LR. The laser LR may be light having a wavelength in a wavelength range that is capable of removing the mask mother substrate MO formed of invar.

In addition, while the plurality of second portions of the mask mother substrate MO are being irradiated with the laser LR, an inspection device TD may detect whether the first portion of the mask mother substrate MO is irradiated with the laser LR or not. That is, if the reflecting plate RS overlapping the first portion of the mask mother substrate MO is irradiated with the laser LR, the laser LR irradiated onto the reflecting plate RS may be sensed by the inspection device TD. In this case, the inspection device TD may detect irradiation of the laser LR onto the mask mother substrate MO and provide a control to align irradiation by the laser LR with the plurality of second portions of the mask mother substrate MO.

Figure 4E:
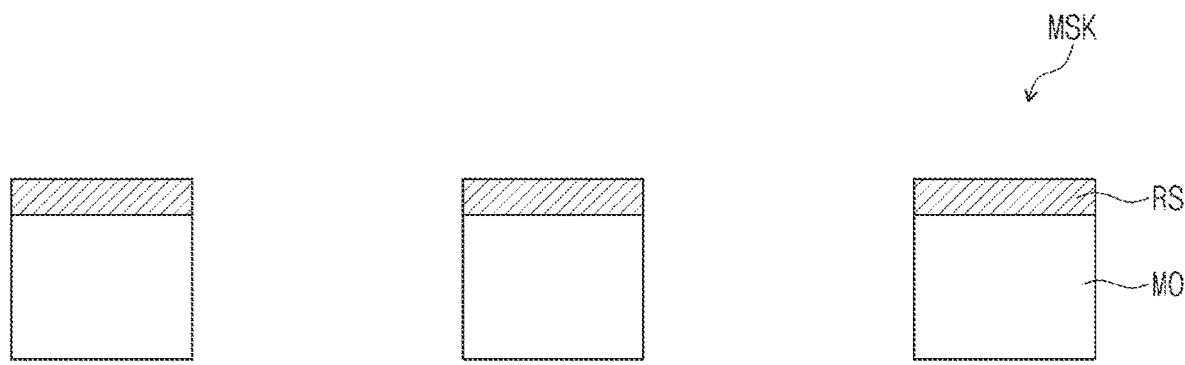

Referring to FIG. 4E, the plurality of second portions of the mask mother substrate MO are removed by the laser LR. As a result, the mask MSK having the plurality of openings corresponding to the opening OM of the display panel DP may be finally provided. As shown in FIG. 4E, the mask MSK may gave a laminated structure including two elements, i.e., the mask mother substrate MO and the reflecting plate RS. The reflecting plate RS included in the mask MSK may entirely overlap the mask mother substrate MO.

As a comparative example, in a case where a mask is manufactured to have a structure without the reflecting plate RS on the mask mother substrate MO, during a process in which the laser LR removes the plurality of second portions of the mask mother substrate MO, the first portion of the mask mother substrate MO may be partially irradiated with the laser LR. As a result, the first portion of the mask mother substrate MO may be damaged.

However, according to the inventive concept, the reflecting plate RS is disposed on the mask mother substrate MO. Therefore, even when the laser LR is partially irradiated onto the first portion of the mask mother substrate MO, the laser LR may be reflected by the reflecting plate RS. As a result, a damage to the first portion of the mask mother substrate MO that can be caused by irradiation of the laser LR onto the first portion of the mask mother substrate MO may be prevented by the reflecting plate RS, and the reliability of the mask MSK may be improved.

FIGS. 5A to FIG. 5E are cross-sectional views showing a method of manufacturing a mask according to another embodiment of the inventive concept. The method of manufacturing a mask shown in FIG. 5A to FIG. 5E may use electroplating.

Figure 5A:
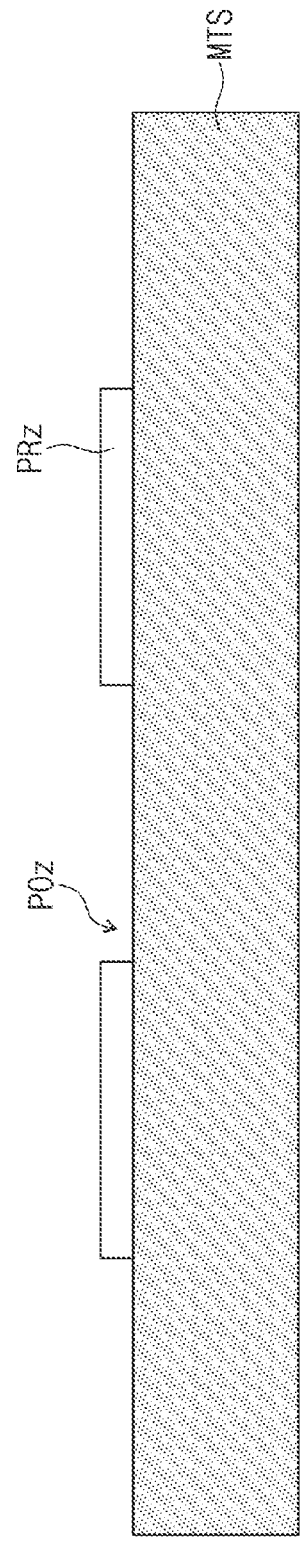
FIGS. 5A to FIG. 5F are cross-sectional views showing a method of manufacturing a mask according to another embodiment of the inventive concept.

Referring to FIG. 5A, a conductive substrate MTS on which a photoresist layer PRz including a plurality of openings POz is formed is provided. The plurality of openings POz included in the photoresist layer PRz may correspond to the plurality of openings PO of the photoresist layer PR described with reference to FIG. 4C. That is, in a plan view, each of the plurality of openings POz included in the photoresist layer PRz may respectively correspond to the opening OM in the pixel areas PXA as shown in FIG. 3B.

Figure 5B:
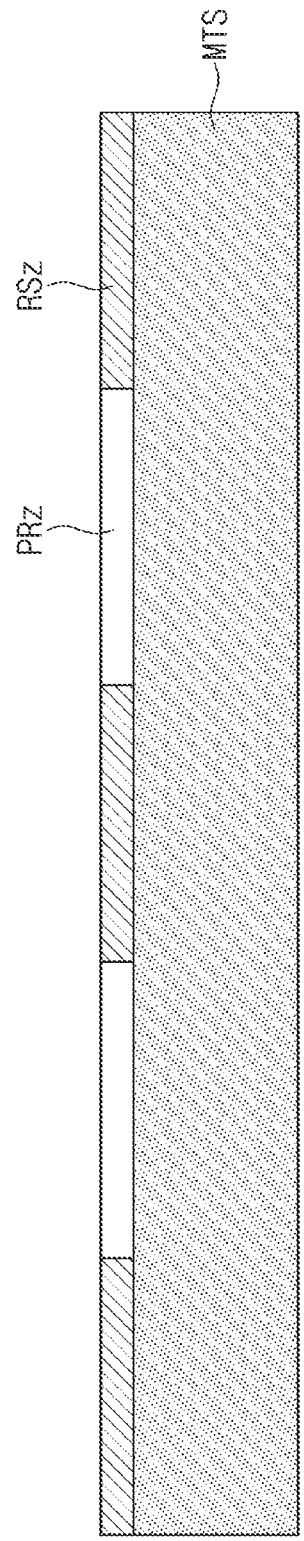

Referring to FIG. 5B, on the conductive substrate MTS, a reflective metal layer RSz may be formed to overlap the plurality of openings POz. According to one embodiment, the reflective metal layer RSz may be formed on the conductive substrate MTS through electroplating. The reflective metal layer RSz shown in FIG. 5B may correspond to the reflecting plate RS shown in FIG. 4D. The reflective metal layer RSz may be provided as a metal film capable of reflecting a laser having a wavelength within a specific wavelength range.

Thereafter, the photoresist layer PRz may be removed.

Figure 5C:
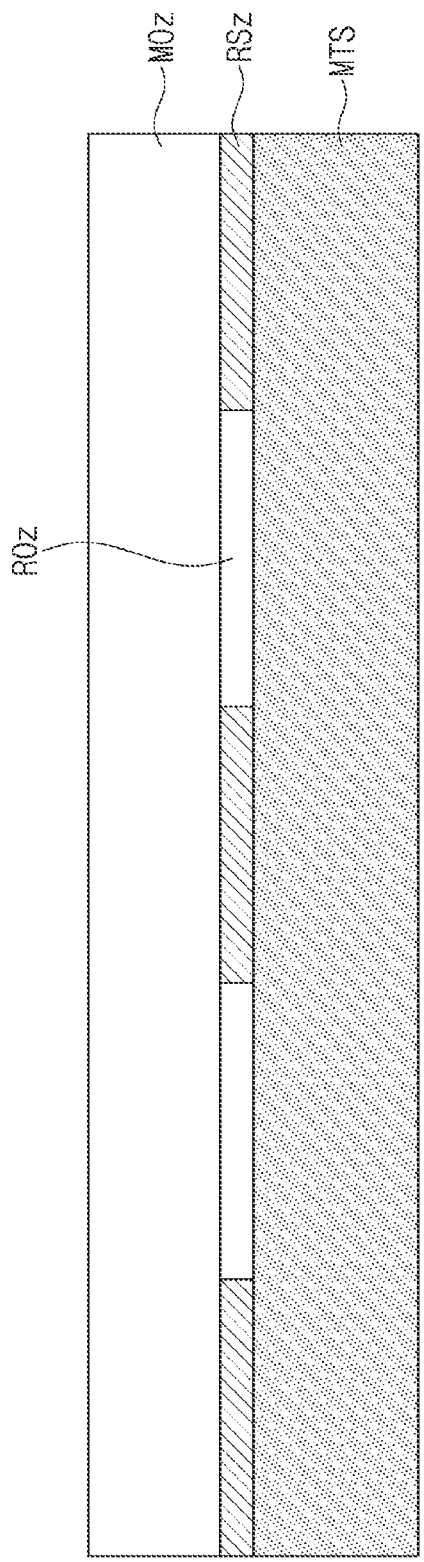

Referring to FIG. 5C, a mask mother substrate MOz may be formed on the reflective metal layer RSz. Because the photoresist layer PRz is removed, a plurality of openings ROz may be defined in the reflective metal layer RSz.

Figure 5D:
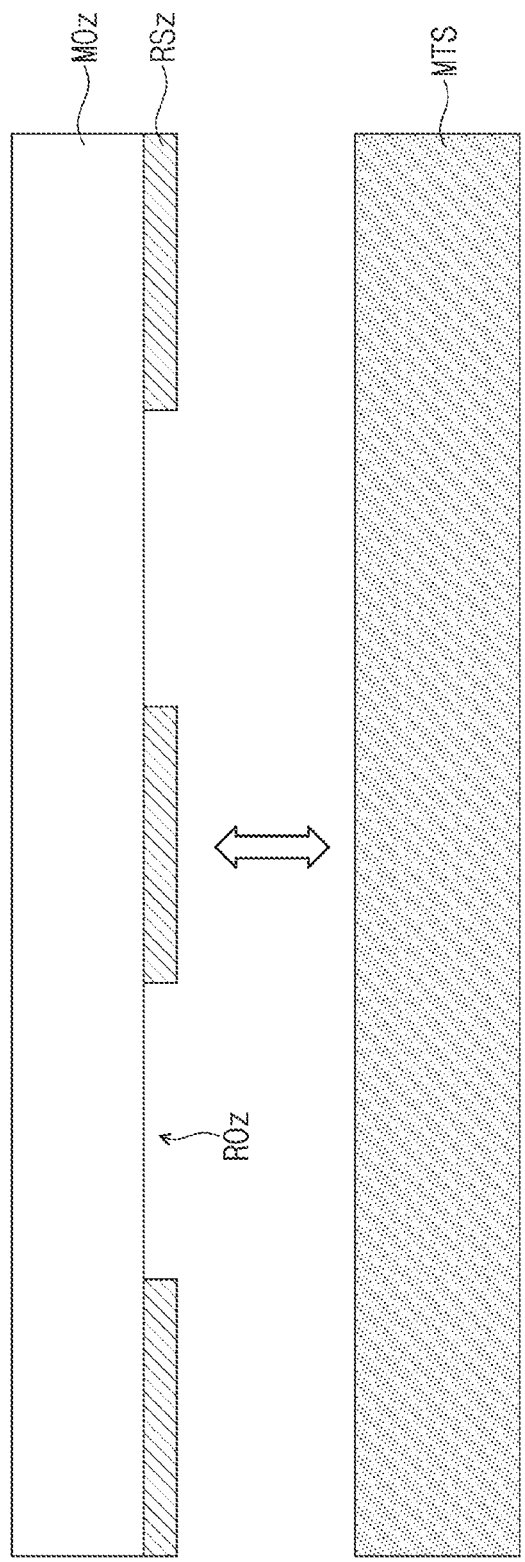

Referring to FIG. 5D, the conductive substrate MTS may be separated from the mask mother substrate MOz and the reflective metal layer RSz. For example, a surface between the conductive substrate MTS and the reflective metal layer RSz may be subjected to a chemical treatment using various release agents such as oxides, hydroxides, and metal salts, and a surface adhesion force between the conductive substrate MTS and the reflective metal layer RSz may be reduced. As a result, the reflective metal layer RSz may be easily separated from the conductive substrate MTS. However, the embodiment of the inventive concept is not limited thereto, and the reflective metal layer RSz may be separated from the conductive substrate MTS using electroforming.

Figure 5E:
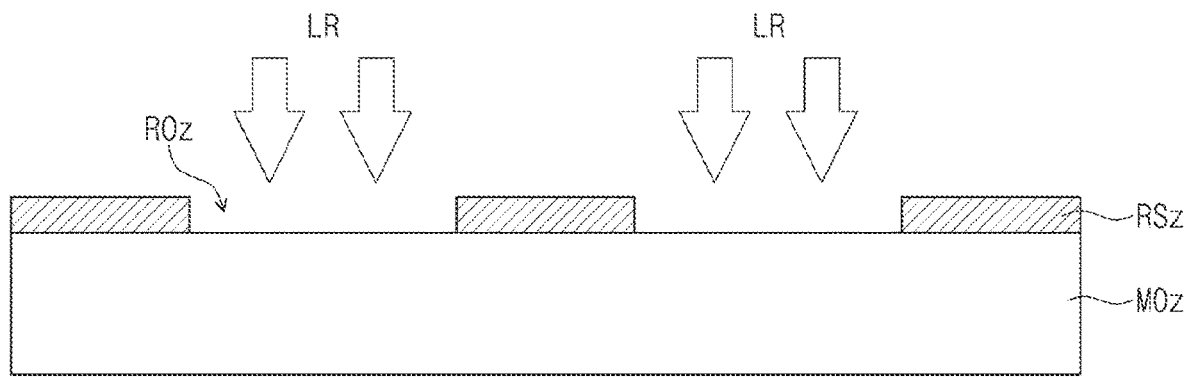
Figure 5F:
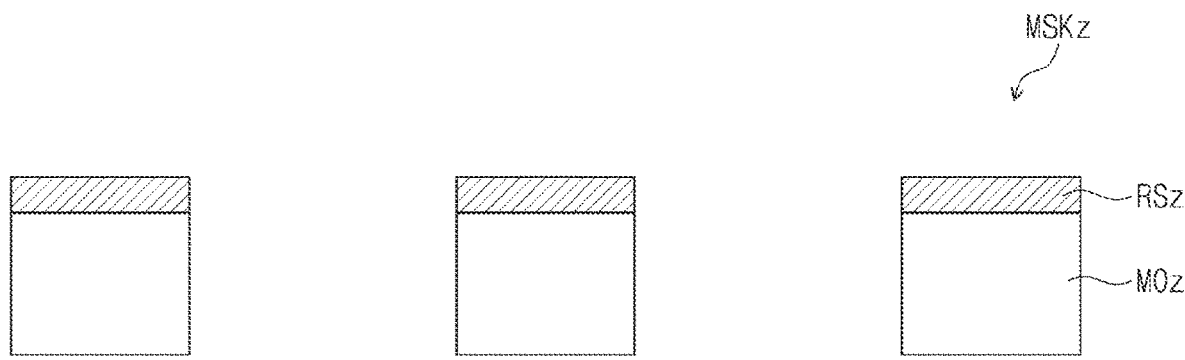

Referring to FIGS. 5E and 5F, a portion of the mask mother substrate MOz may be removed by the laser LR. For example, the laser LR is irradiated onto the plurality of openings ROz included in the reflecting plate RSz, and the portion of the mask mother substrate MOz exposed by the plurality of openings ROz and irradiated by the laser LR may be removed.

As a result, a mask MSKz shown in FIG. 5F may be finally provided. As shown in FIG. 5F, the mask MSKz may have a laminated structure including two elements, i.e., the mask mother substrate MOz and the reflective metal layer RSz. The reflective metal layer RSz included in the mask MSKz may entirely overlap the mask mother substrate MOz.

According to one embodiment, each of the mask MSK disclosed in FIG. 4E and the mask MSKz disclosed in FIG. 5F may be used to deposit the light emitting layer EML of the display panel DP through the opening OM as shown in FIG. 3B.

According to an embodiment of the inventive concept, a mask may be provided in a laminated structure including two elements of a mask mother substrate and a reflecting plate. The mask may include a plurality of openings for depositing a deposition material passing through the mask mother substrate and the reflecting plate.

In particular, while a portion of the mask mother substrate is being irradiated with a laser to form the plurality of openings in the mask mother substrate, a damage to other portions of the mask mother substrate that can be caused by irradiation of the laser may be prevented by the reflecting plate. As a result, the overall reliability of the mask may be improved.

As described above, an embodiment of the inventive concept has been disclosed in the specification with reference to the drawings of the exemplary embodiments. Although specific terms have been used herein, they have been merely used for the purpose of describing the inventive concept, and are not intended to limit the scope of the inventive concept as set forth in the present disclosure and/or the claims. Therefore, it will be understood by those skilled in the art that various modifications and equivalent embodiments thereto may be implemented without deviating from the scope and spirit of the present disclosure. Accordingly, the true scope of the inventive concept should be determined by the technical ideas and merits of the appended claims.

What is claimed is:

1. A method of manufacturing a mask, the method comprising:
   providing a conductive substrate on which a photoresist layer including a plurality of openings is formed;
   forming a reflective metal layer by performing electroplating on the conductive substrate overlapping the plurality of openings;
   removing the photoresist layer;
   forming a mask mother substrate on the reflective metal layer;
   separating the conductive substrate from the reflective metal layer and the mask mother substrate; and
   removing portions of the mask mother substrate that do not overlap the reflective metal layer using a laser.

2. The method of claim 1, wherein
   a first thickness of the mask mother substrate is greater than a second thickness of the reflective metal layer.

3. The method of claim 1, wherein
   the reflective metal layer reflects light corresponding to a wavelength in a wavelength range of the laser.

\* \* \* \* \*